(12) United States Patent
Park

(10) Patent No.: US 11,774,499 B2
(45) Date of Patent: Oct. 3, 2023

(54) RELAY DIAGNOSIS DEVICE, RELAY DIAGNOSIS METHOD, BATTERY SYSTEM, AND ELECTRIC VEHICLE

(71) Applicant: LG Energy Solution, Ltd., Seoul (KR)

(72) Inventor: Jong-Il Park, Daejeon (KR)

(73) Assignee: LG Energy Solution, Ltd.

( * ) Notice: Subject to any disclaimer, the term of this patent is extended or adjusted under 35 U.S.C. 154(b) by 0 days.

(21) Appl. No.: 17/798,151

(22) PCT Filed: Sep. 28, 2021

(86) PCT No.: PCT/KR2021/013269
§ 371 (c)(1),
(2) Date: Aug. 8, 2022

(87) PCT Pub. No.: WO2022/080709
PCT Pub. Date: Apr. 21, 2022

(65) Prior Publication Data
US 2023/0099667 A1     Mar. 30, 2023

(30) Foreign Application Priority Data
Oct. 15, 2020 (KR) .......... 10-2020-0133688

(51) Int. Cl.
G01R 31/327 (2006.01)
B60L 3/00 (2019.01)
G01R 31/12 (2020.01)

(52) U.S. Cl.
CPC ............ *G01R 31/3272* (2013.01); *B60L 3/00* (2013.01); *G01R 31/1227* (2013.01)

(58) Field of Classification Search
CPC ............ G01R 31/1227; G01R 31/3272; G01R 31/3278; G01R 31/52; G01R 31/3842;
(Continued)

(56) References Cited

U.S. PATENT DOCUMENTS 10,067,176 B2 * 9/2018 Sung .................. H01M 50/569
2016/0223615 A1 8/2016 Nishi et al.
(Continued)

FOREIGN PATENT DOCUMENTS

JP    2005149843 A    6/2005
JP    2007329045 A    12/2007
(Continued)

OTHER PUBLICATIONS

International Search Report for Application No. PCT/KR2021/013269 dated Jan. 27, 2022, pp. 1-3.

*Primary Examiner* — Thang X Le
(74) *Attorney, Agent, or Firm* — Lerner David LLP

(57) ABSTRACT

A relay diagnosis apparatus includes a first voltage detection circuit to generate first and second diagnosis voltages between positive and negative electrode terminals of a battery assembly and a chassis, respectively; and a controller to determine first and second insulation resistances between the positive and negative electrode terminals and the chassis, respectively, based on the first and second diagnosis voltages at first and second time points while respective relays are controlled into an off-state. The controller determines third and fourth insulation resistances between the positive and negative electrode terminals and the chassis, respectively, based on the first and second diagnosis voltages at third and fourth time points while the first and second relays are controlled into an on-state. The controller detects relay faults based on the insulation resistances.

10 Claims, 3 Drawing Sheets

(58) Field of Classification Search
CPC .. G01R 31/327; G01R 31/374; G01R 31/385; G01R 31/389; G01R 27/025; G01R 27/18; B60L 3/00; B60L 3/0023; B60L 3/0069; B60L 2240/527; B60L 2240/529; B60L 2240/547; B60L 2240/549
See application file for complete search history.

(56) References Cited

U.S. PATENT DOCUMENTS

| | | | |
|---|---|---|---|
| 2017/0176509 A1* | 6/2017 | Schulz | G01R 31/006 |
| 2017/0225572 A1 | 8/2017 | Kawanaka et al. | |
| 2017/0227589 A1 | 8/2017 | Kawanaka et al. | |
| 2020/0049768 A1 | 2/2020 | Matsukawa et al. | |
| 2020/0116791 A1 | 4/2020 | Song | |
| 2020/0142002 A1 | 5/2020 | Park et al. | |
| 2020/0217893 A1* | 7/2020 | Song | H01M 10/48 |
| 2021/0102998 A1* | 4/2021 | Azidehak | B60R 16/02 |

FOREIGN PATENT DOCUMENTS

| | | |
|---|---|---|
| JP | 201579730 A | 4/2015 |
| JP | 2016219229 A | 12/2016 |
| JP | 2017138278 A | 8/2017 |
| JP | 2017143662 A | 8/2017 |
| JP | 2018026889 A | 2/2018 |
| JP | 2020521423 A | 7/2020 |
| JP | 2020523742 A | 8/2020 |
| JP | 2020524263 A | 8/2020 |
| KR | 20130039817 A | 4/2013 |
| KR | 20130119666 A | 11/2013 |
| KR | 101795319 B1 | 12/2017 |
| KR | 20190108379 A | 9/2019 |
| KR | 102155207 B1 | 9/2020 |
| WO | 2018211933 A1 | 11/2018 |

* cited by examiner

RELAY DIAGNOSIS DEVICE, RELAY DIAGNOSIS METHOD, BATTERY SYSTEM, AND ELECTRIC VEHICLE

CROSS-REFERENCE TO RELATED APPLICATIONS

The present application is a national phase entry under 35 U.S.C. § 371 of International Application No. PCT/KR2021/013269 filed Sep. 28, 2021, which claims priority from Korean Patent Application No. 10-2020-0133688 filed Oct. 15, 2020, all of which are incorporated herein by reference.

TECHNICAL FIELD

The present disclosure relates to technology that diagnoses a relay installed on a power line connecting a battery to a load.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little Of no memory effect, and thus they are gaining more attention than nickel-based batteries for their advantages that recharging can be done whenever it is convenient, the self-discharge rate is very low and the energy density is high.

In general, various types of electric devices requiring electrical energy, for example, electric vehicles include a battery assembly, an electrical load and two relays, each installed on each of positive and negative electrode sides of a battery. For stable power supply between the battery assembly and the electrical load, each relay needs to be able to normally switch between on-state and off-state in response to an external command There are two typical fault types of the relay: a short circuit fault (referred to as 'closed stuck fault') and an open circuit fault (referred to as 'open stuck fault'). The short circuit fault refers to the relay stuck in the on-state and unable to switch from the on-state to the off-state. On the contrary, the open circuit fault refers to the relay stuck in the off-state and unable to switch from the off-state to the on-state.

In relation to this, relay fault diagnosis methods based on a voltage difference between two ends of the relay are widely used.

However, when the relay is kept in the on-state for a predetermined time or more, a smoothing capacitor (also known as 'X-cap') provided in the electrical load is charged with the equivalent level of voltage to the battery assembly. Accordingly, the relay is normally switched from the on-state to the off-state, but a sufficient voltage difference is not generated across the two ends of the relay, so there is a high probability of wrong diagnosis that the relay is in a short circuit fault.

To solve the above-described problem, there is a method that forcibly discharges the smoothing capacitor prior to the relay diagnosis by connecting in parallel a discharge circuit (a series circuit of a discharge switch and a discharge resistor) to the smoothing capacitor. However, when a fault occurs in the discharge circuit, it is impossible to discharge the smoothing capacitor, and even though the discharge circuit is normal, the forcible discharge procedure for the high capacity smoothing capacitor requires a considerable amount of time.

SUMMARY

Technical Problem

The present disclosure is designed to solve the above-described problem, and therefore the present disclosure is directed to providing an apparatus and method for fault detection of each relay based on a change in insulation resistance between a battery assembly and a chassis of an electric vehicle by controlling the switch between on-state and off-state of two relays, each installed on each of a pair of power lines connecting a battery assembly to an electrical load, and an electric vehicle including the apparatus.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A relay diagnosis apparatus according to an aspect of the present disclosure is for a first relay installed on a first power line connecting an electrical load of an electric vehicle to a battery assembly and a second relay installed on a second power line connecting the electrical load to the battery assembly. The relay diagnosis apparatus includes a first voltage detection circuit configured to generate a first diagnosis voltage at a first position between a positive electrode terminal of the battery assembly and a chassis of the electric vehicle; a second voltage detection circuit configured to generate a second diagnosis voltage at a second position between a negative electrode terminal of the battery assembly and the chassis; and a controller configured to determine a first insulation resistance between the positive electrode terminal and the chassis based on the first diagnosis voltage at a first time point while the first relay and is controlled into an off-state and determine a second insulation resistance between the negative electrode terminal and the chassis based on the second diagnosis voltage at a second time point while the second relay and is controlled into an off-state. The controller is configured to determine a third insulation resistance between the positive electrode terminal and the chassis based on the first diagnosis voltage at a third time point while the first relay is being controlled into an on-state and determine a fourth insulation resistance between the negative electrode terminal and the chassis based on the second diagnosis voltage at a fourth time point while the second relay is controlled into an on-state. The controller is configured to detect a fault of the first relay based on the first insulation resistance and the third insulation resistance and detect a fault of the second relay based on the second insulation resistance and the fourth insulation resistance.

The first voltage detection circuit may be includes a first voltage divider and a first switch serially connected to one another between the positive electrode terminal and the chassis. The second voltage detection circuit may be includes a second voltage divider and a second switch serially connected to one another between the negative electrode terminal and the chassis. Each of the first and second voltage dividers may include two resistors in series with one another.

The controller may be configured to control the first switch and the second switch into the on-state and the off-state, respectively, during the first time point and control the first switch and the second switch into the off-state and the on-state, respectively, during the second time point.

The controller may be configured to control the first switch and the second switch into the on-state and the off-state, respectively, during the third time point and control the first switch and the second switch into the off-state and the on-state, respectively, during the fourth time point.

The controller may be configured to determine that the first relay is faulty in response to either (i) a resistance difference between the first insulation resistance and the third insulation resistance being equal to or less than a threshold resistance, or (ii) a ratio of the resistance difference to the first insulation resistance being equal to or less than a threshold ratio.

The controller may be configured to determine that the first relay is in an open circuit fault in response to the third insulation resistance being equal to or higher than a first reference resistance.

The controller may be configured to determine that the second relay is faulty in response to either (i) a resistance difference between the second insulation resistance and the fourth insulation resistance being equal to or less than a threshold resistance, or (ii) a ratio of the resistance difference to the second insulation resistance being equal to or less than a threshold ratio.

The controller may be configured to determine that the second relay is in an open circuit fault in response to the fourth insulation resistance being equal to or higher than a second reference resistance.

An electric vehicle according to another aspect of the present disclosure includes a relay diagnosis apparatus as described in any of the embodiments herein.

A relay diagnosis method for diagnosing a first relay installed on a first power line connecting an electrical load of an electric vehicle to a battery assembly and a second relay installed on a second power line connecting the electrical load to the battery assembly includes determining, by the controller, a first insulation resistance between a positive electrode terminal of the battery assembly and a chassis of the electric vehicle based on a first diagnosis voltage generated at a first position between the positive electrode terminal of the battery assembly and the chassis at a first time point while a first relay and is controlled into an off-state; determining, by the controller, a second insulation resistance between a negative electrode terminal of the battery assembly and the chassis based on a second diagnosis generated at a second position between the negative electrode terminal of the battery assembly and the chassis at a second time point while a second relay and is controlled into an off-state; determining, by the controller, a third insulation resistance between the positive electrode terminal and the chassis based on the first diagnosis voltage at a third time point while the first relay is controlled into an on-state; determining, by the controller, a fourth insulation resistance between the negative electrode terminal and the chassis based on the second diagnosis voltage at a fourth time point while the second relay is controlled into an on-state; and either (i) detecting, by the controller, a fault of the first relay based on the first insulation resistance and the third insulation resistance; or (ii) detecting, by the controller, a fault of the second relay based on the second insulation resistance and the fourth insulation resistance.

Advantageous Effects

According to at least one of the embodiments of the present disclosure, it is possible to detect defects of each relay based on a change in insulation resistance between a battery assembly and a chassis of an electric vehicle by controlling the switch between on-state and off-state of two relays, each installed on each of a pair of power lines connecting the battery assembly to the electrical load.

Additionally, according to at least one of the embodiments of the present disclosure, it is possible to detect faults of each relay without an element (for example, a discharge circuit) and a control procedure necessary to forcibly discharge a smoothing capacitor.

Additionally, according to at least one of the embodiments of the present disclosure, it is possible to detect faults of each relay without an element (for example, a voltage sensor) and a procedure necessary to measure the voltage (i.e., voltage across the smoothing capacitor) on the side of the electrical load.

The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Figure 1:
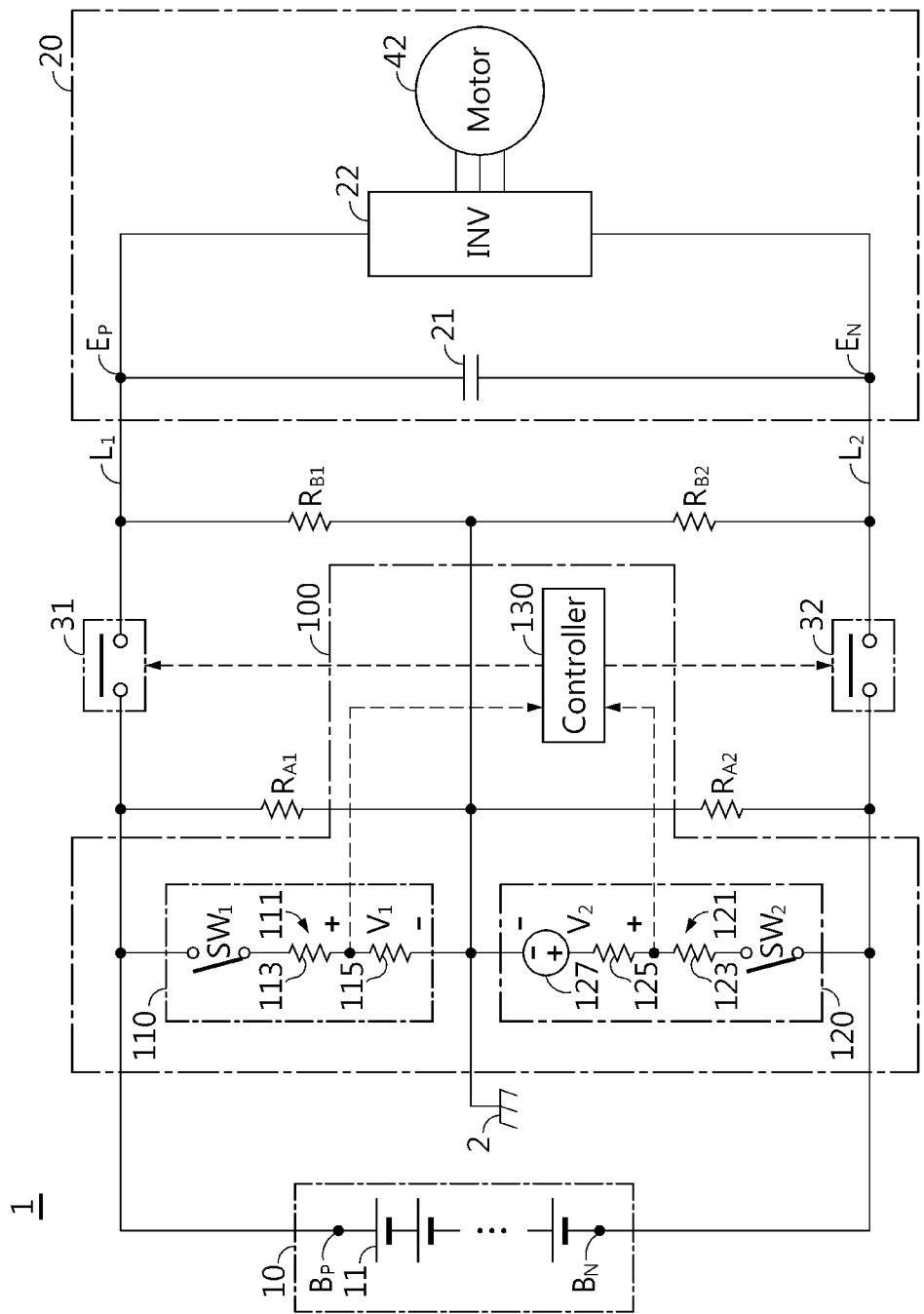
FIG. 1 is a diagram illustrating exemplarily a configuration of an electric vehicle according to the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and the illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "unit" refers to a processing unit of at least one function or operation, and this may be implemented by hardware and software either alone or in combination.

In addition, throughout the specification, it will be further understood that when an element is referred to as being "connected to" another element, it can be directly connected to the other element or intervening elements may be present.

FIG. 1 is a diagram illustrating exemplarily a configuration of an electric vehicle 1 according to the present disclosure.

Referring to FIG. 1, the electric vehicle 1 includes a chassis 2, a battery assembly 10, an electrical load 20, a first relay 31, a second relay 32 and a relay diagnosis apparatus.

The battery assembly 10 includes a plurality of battery cells 11 connected in series. The battery cell 11 may be, for example, a lithium ion battery cell 11. The battery cell 11 is not limited to a particular type and may include any type of battery cell that can be repeatedly recharged.

The electrical load 20 includes a smoothing capacitor 21, an inverter 22 and an electric motor 23.

The smoothing capacitor 21 is connected in parallel to a series circuit of the battery assembly 10, the first relay 31 and the second relay 32, to prevent a sharp change in direct current power between the battery assembly 10 and the inverter 22.

While both the first relay 31 and the second relay 32 are being in an on-state, the inverter 22 converts the direct current power supplied from the battery assembly 10 through the smoothing capacitor 21 to alternating current power and supplies the alternating current power to the electric motor 23.

The first relay 31 is installed on a power line $L_1$ connecting a positive electrode terminal $B_P$ of the battery assembly 10 to a plus terminal $E_P$ of the electrical load 20. That is, a first end and a second end of the first relay 31 are connected to the positive electrode terminal $B_P$ of the battery assembly 10 and one end of the smoothing capacitor 21, respectively.

The second relay 32 is installed on a power line $L_2$ connecting a negative electrode terminal $B_N$ of the battery assembly 10 to a minus terminal $E_N$ of the electrical load 20. That is, the first end and the second end of the second relay 32 are connected to the negative electrode terminal $B_N$ of the battery assembly 10 and the other end of the smoothing capacitor 21, respectively.

Meanwhile, each of $R_{A1}$, $R_{A2}$, $R_{B1}$ and $R_{B2}$ shown in FIG. 1 indicates four insulation resistances present in the electric vehicle 1. Each insulation resistance is not a resistance of a physical resistor, and is an imaginary resistance component indicating the insulation condition between a specific location of the electric vehicle 1 and the chassis 2.

The insulation resistance $R_{A1}$ indicates a first insulation condition between the positive electrode terminal $B_P$ of the battery assembly 10 and the chassis 2, the insulation resistance $R_{A2}$ indicates a second insulation condition between the negative electrode terminal $B_N$ of the battery assembly 10 and the chassis 2, the insulation resistance $R_{B1}$ indicates a third insulation condition between the plus terminal $E_P$ of the electrical load 20 and the chassis 2, and the insulation resistance $R_{B2}$ indicates a fourth insulation condition between the minus terminal $E_N$ of the electrical load 20 and the chassis 2.

When the insulation condition is normal, each insulation resistance has, for example, a very large value of 10 [MΩ] or more. When the insulation condition is abnormal (i.e., dielectric breakdown) due to flood damage of the electric vehicle 1, each insulation resistance is reduced to, for example, a very small value of 10 [Ω] or less.

When the first relay 31 is in an off-state, the insulation resistance $R_{B1}$ is electrically separated from the insulation resistance $R_{A1}$, and thus only the insulation resistance $R_{A1}$ affects a first diagnosis voltage $V_1$. In contrast, when the first relay 31 is in the on-state, the insulation resistance $R_{B1}$ is connected in parallel to the insulation resistance $R_{A1}$, and thus the combined resistance of the insulation resistance $R_{A1}$ and the insulation resistance $R_{B1}$ affects the first diagnosis voltage $V_1$.

When the second relay 32 is in the off-state, the insulation resistance $R_{B2}$ is electrically separated from the insulation resistance $R_{A2}$, and thus only the insulation resistance $R_{A2}$ affects a second diagnosis voltage $V_2$. In contrast, when the second relay 32 is in the on-state, the insulation resistance $R_{B2}$ is connected in parallel to the insulation resistance $R_{A2}$, and thus the combined resistance of the insulation resistance $R_{A2}$ and the insulation resistance $R_{B2}$ affects the second diagnosis voltage $V_2$.

That is, the first diagnosis voltage $V_1$ and the second diagnosis voltage $V_2$ may be changed by the switch of each of the first relay 31 and the second relay 32 between the off-state and the on-state.

The relay diagnosis apparatus 100 includes a first voltage detection circuit 110, a second voltage detection circuit 120 and a controller 130.

The first voltage detection circuit 110 is provided such that it is connectable between the positive electrode terminal $B_P$ and the chassis 2. The first voltage detection circuit 110 may selectively provide a first electric current path between the positive electrode terminal $B_P$ and the chassis 2. When the first electric current path is provided, the first voltage detection circuit 110 may divide the voltage between the positive electrode terminal $B_P$ and the chassis 2 at a predetermined ratio to generate the first diagnosis voltage $V_1$.

The first voltage detection circuit 110 may be a series circuit of a first voltage divider 111 and a first switch $SW_1$. The first voltage divider 111 may include a first protection resistor 113 and a first detection resistor 115 connected in series. When the first switch $SW_1$ is in the on-state, the first electric current path is provided. The first diagnosis voltage $V_1$ may be a voltage across the first detection resistor 115.

The second voltage detection circuit 120 is provided such that it is connectable between the negative electrode terminal $B_N$ and the chassis 2. The second voltage detection circuit 120 may selectively provide a second electric current path between the negative electrode terminal $B_N$ and the chassis 2. When the second electric current path is provided, the second voltage detection circuit 120 may divide the voltage between the negative electrode terminal $B_N$ and the chassis 2 at a predetermined ratio to generate the second diagnosis voltage $V_2$.

The second voltage detection circuit 120 may be a series circuit of a second voltage divider 121 and a second switch $SW_2$ or a series circuit of a constant voltage source 127, the second voltage divider 121 and the second switch $SW_2$. The second voltage divider 121 may include a second protection resistor 123 and a second detection resistor 125 connected in series. When the second switch $SW_2$ is in the on-state, the second electric current path is provided. The second diagnosis voltage $V_2$ may be the sum of the voltage across the second detection resistor 125 and the output voltage of the constant voltage source 127.

The resistance of the first protection resistor 113 may be equal to the resistance of the second protection resistor 123. The resistance of the first detection resistor 115 may be equal to the resistance of the second detection resistor 125.

By the output voltage of the constant voltage source 127, a larger voltage than 0 [V] may be inputted to the controller 130 as the second diagnosis voltage $V_2$. The magnitude of the output voltage may be preset, taking into account the rated voltage of the battery assembly 10 and a resistance ratio between the second protection resistor 123 and the second detection resistor 125.

The first switch $SW_1$ and the second switch $SW_2$ may include well-known switching devices, for example, MOSFET.

The controller 130 is operably coupled to the first voltage detection circuit 110 and the second voltage detection circuit 120. The controller 130 may be additionally operably coupled to the first relay 31 and the second relay 32. Operably coupled refers to directly/indirectly connected to transmit and receive a signal in one or two directions.

The controller 130 may include a data processing unit. The data processing unit may be implemented in hardware, including at least one of application specific integrated circuits (ASICs), digital signal processors (DSPs), digital signal processing devices (DSPDs), programmable logic devices (PLDs), field programmable gate arrays (FPGAs), microprocessors or electrical units for performing the other functions. The data processing unit is responsible for various computation processing for relay diagnosis and output of various signals for relay control.

The controller 130 may include a switch driver. The switch driver may output switching signals for on/off control of each of the first relay 31, the second relay 32, the first switch $SW_1$ and the second switch $SW_2$ in response to a command from the data processing unit.

The controller 130 may include an analog-digital converter. The analog-digital converter may convert an analog signal of the first diagnosis voltage $V_1$ and the second diagnosis voltage $V_2$ into a digital value.

The controller 130 may include a memory. The memory may store programs and data necessary to perform methods as described below. The memory may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The controller 130 may individually control the on/off of the first relay 31, the second relay 32, the first switch $SW_1$ and the second switch $SW_2$.

The controller 130 controls the first switch $SW_1$ into the on-state and the second switch $SW_2$ into the off-state at a first time point while controlling the first relay 31 and the second relay 32 into the off-state. The controller 130 may record, in the memory, a first measurement value of the first diagnosis voltage $V_1$ generated by the first voltage detection circuit 110 at the first time point. The controller 130 controls the first switch $SW_1$ into the off-state and the second switch $SW_2$ into the on-state at a second time point while controlling the first relay 31 and the second relay 32 into the off-state. The controller 130 may record, in the memory, a second measurement value of the second diagnosis voltage $V_2$ generated by the second voltage detection circuit 120 at the second time point.

The controller 130 controls the first switch $SW_1$ into the on-state and the second switch $SW_2$ into the off-state at a third time point while controlling the first relay 31 and the second relay 32 into the on-state. The controller 130 may record, in the memory, a third measurement value of the first diagnosis voltage $V_1$ generated by the first voltage detection circuit 110 at the third time point. The controller 130 controls the first switch $SW_1$ into the off-state and the second switch $SW_2$ into the on-state at a fourth time point while controlling the first relay 31 and the second relay 32 into the on-state. The controller 130 may record, in the memory, a fourth measurement value of the second diagnosis voltage $V_2$ generated by the second voltage detection circuit 120 at the fourth time point.

The controller 130 may monitor (predict) the first to fourth insulation resistances as described below while controlling the on/off of the first relay 31 and the second relay 32. The following equation may be an example of a function that may be used for the controller 130 to calculate each of the first to fourth insulation resistances.

$$R_{Leak(+)} = \frac{(V_{Bat} - A)(V_{Bat} - C) - AC}{D(V_{Bat} - A) + BC}$$

$$R_{Leak(-)} = \frac{(V_{Bat} - A)(V_{Bat} - C) - AC}{B(V_{Bat} - A) + AD}$$

$$\therefore A = \left(\frac{V_1}{R_2}\right)R_1 + V_1$$

$$\therefore B = \frac{V_1}{R_2}$$

$$\therefore C = \left(\frac{V_{DC} - V_2}{R_2}\right)R_1 - V_2$$

$$\therefore D = \frac{V_{DC} - V_2}{R_2}$$

In the above equation, $R_{Leak(+)}$ denotes the insulation resistance between the positive electrode terminal $B_P$ and the chassis 2, $R_{Leak(-)}$ denotes the insulation resistance between the negative electrode terminal $B_N$ and the chassis 2, $V_{Bat}$ denotes the voltage across the battery assembly 10, $V_1$ denotes the first diagnosis voltage, $V_2$ denotes the second diagnosis voltage, $R_1$ denotes the resistance of the first protection resistor 113, $R_2$ denotes the resistance of the first detection resistor 115, and $V_{DC}$ denotes the output voltage of the constant voltage source 127.

The controller 130 may determine $V_{Bat}$ by multiplying the sum of the first diagnosis voltage $V_1$ and the second diagnosis voltage $V_2$ by the above-described ratio while controlling both the first switch $SW_1$ and the second switch $SW_2$ into the on-state. Alternatively, $V_{Bat}$ may be measured by an additional voltage detection circuit (not shown) connected in parallel to the battery assembly 10.

The controller 130 may record, in the memory, $R_{Leak(+)}$ and $R_{Leak(-)}$ when inputting the first diagnosis voltage $V_1$ at the first time point and the second diagnosis voltage $V_2$ at the second time point into $V_1$ and $V_2$ of the above equation as the first insulation resistance and the second insulation resistance. The first insulation resistance and the second insulation resistance indicate the insulation resistance between the positive electrode terminal $B_P$ and the chassis 2 and the insulation resistance between the negative electrode terminal $B_N$ and the chassis 2 while controlling the first relay 31 and the second relay 32 into the off-state, respectively.

When the first relay 31 is in the off-state at the first time point without a short circuit fault, the first insulation resistance may be equal to the insulation resistance $R_{A1}$. In contrast, when the first relay 31 is kept in the on-state at the first time point due to a short circuit fault, the first insulation resistance may be equal to the combined resistance of the insulation resistance $R_{A1}$ and the insulation resistance $R_{B1}$. The combined resistance of the insulation resistance $R_{A1}$ and the insulation resistance $R_{B1}$ is $(R_{A1} \times R_{B1})/(R_{A1}+R_{B1})$.

When the second relay 32 is in the off-state at the second time point without a short circuit fault, the second insulation resistance may be equal to the insulation resistance $R_{A2}$. In contrast, when the second relay 32 is kept in the on-state at the second time point due to a short circuit fault, the second insulation resistance may be equal to the combined resistance of the insulation resistance $R_{A2}$ and the insulation resistance $R_{B2}$. The combined resistance of the insulation resistance $R_{A2}$ and the insulation resistance $R_{B2}$ is $(R_{A2} \times R_{B2})/(R_{A2}+R_{B2})$.

The controller 130 may record, in the memory, $R_{Leak(+)}$ and $R_{Leak(-)}$ when inputting the first diagnosis voltage $V_1$ at the third time point and the second diagnosis voltage $V_2$ at the fourth time point into $V_1$ and $V_2$ of the above equation as the third insulation resistance and the fourth insulation resistance. The third insulation resistance and the fourth insulation resistance indicate the insulation resistance between the positive electrode terminal $B_P$ and the chassis 2 and the insulation resistance between the negative electrode terminal $B_N$ and the chassis 2 while controlling the first relay 31 and the second relay 32 into the on-state, respectively.

The above equation is an example of a function used to determine the first to fourth insulation resistances, and instead of the above equation, at least one other well-known functions may be used.

When the first relay 31 is in the on-state at the third time point without an open circuit fault, the third insulation resistance may be equal to the combined resistance of the insulation resistance $R_{A1}$ and the insulation resistance $R_{B1}$. In contrast, when the first relay 31 is kept in the off-state at the third time point due to an open circuit fault, the third insulation resistance may be equal to the insulation resistance $R_{A1}$.

When the second relay 32 is in the on-state at the fourth time point without an open circuit fault, the fourth insulation resistance may be equal to the combined resistance of the insulation resistance $R_{A2}$ and the insulation resistance $R_{B2}$. In contrast, when the second relay 32 is kept in the off-state at the fourth time point due to an open circuit fault, the second insulation resistance may be equal to the insulation resistance $R_{A2}$.

Figure 2:
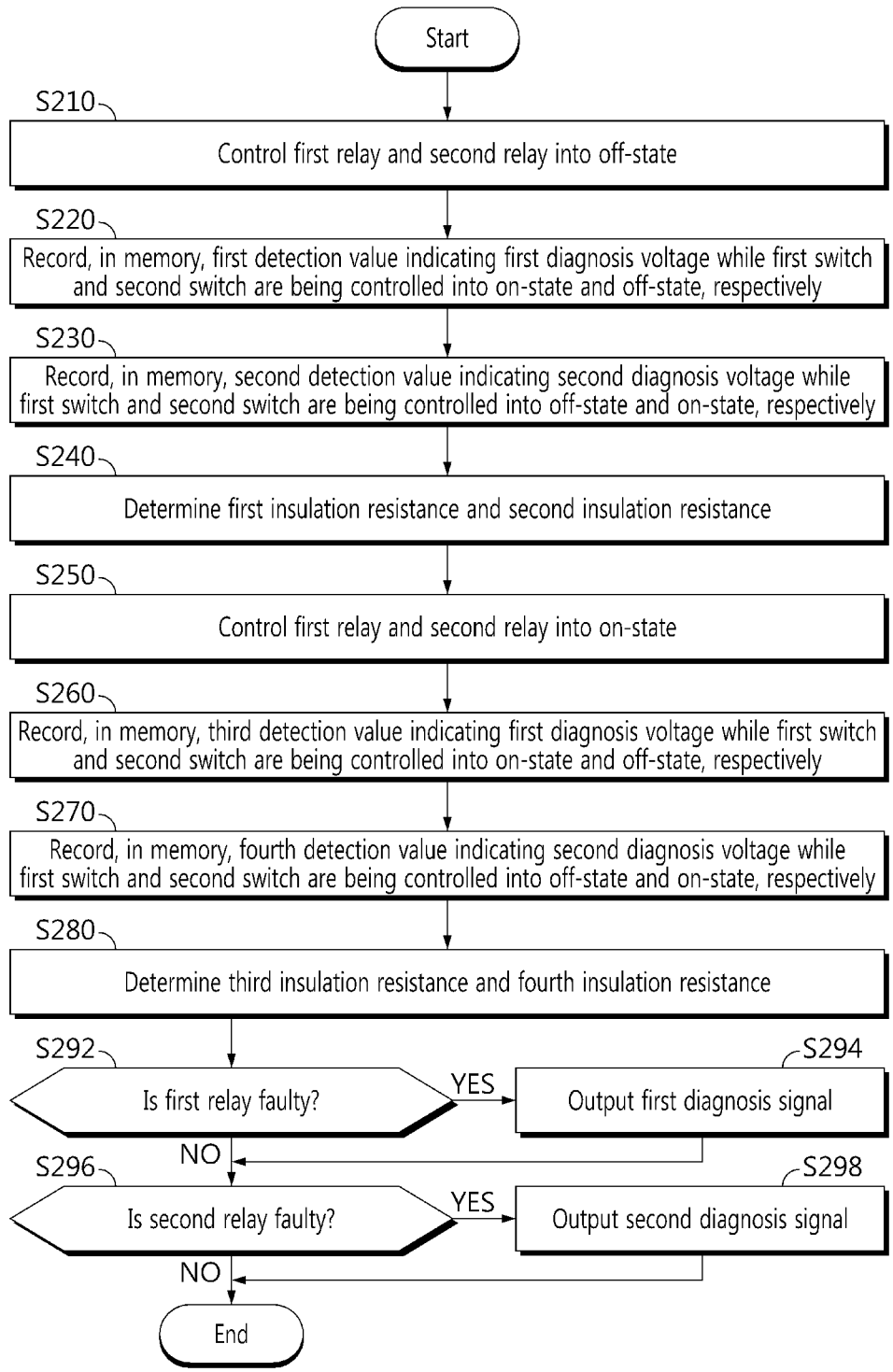
FIG. 2 is a flowchart illustrating exemplarily a relay diagnosis method according to a first embodiment, executable by a relay diagnosis apparatus shown in FIG. 1.

FIG. 2 is a flowchart illustrating exemplarily a relay diagnosis method according to a first embodiment, executable by the relay diagnosis apparatus 100 shown in FIG. 1.

Referring to FIGS. 1 and 2, in step S210, the controller 130 controls the first relay 31 and the second relay 32 into the off-state.

In step S220, the controller 130 records, in the memory, a first detection value indicating the first diagnosis voltage $V_1$ while the first switch $SW_1$ and the second switch $SW_2$ are being controlled into the on-state and the off-state, respectively.

In step S230, the controller 130 records, in the memory, a second detection value indicating the second diagnosis voltage $V_2$ while the first switch $SW_1$ and the second switch $SW_2$ are being controlled into the off-state and the on-state, respectively.

In step S240, the controller 130 determines the first insulation resistance and the second insulation resistance based on the first detection value and the second detection value.

In step S250, the controller 130 controls the first relay 31 and the second relay 32 into the on-state.

In step S260, the controller 130 records, in the memory, a third detection value indicating the first diagnosis voltage $V_1$ while the first switch $SW_1$ and the second switch $SW_2$ are being controlled into the on-state and the off-state, respectively.

In step S270, the controller 130 records, in the memory, a fourth detection value indicating the second diagnosis voltage $V_2$ while the first switch $SW_1$ and the second switch $SW_2$ are being controlled into the off-state and the on-state, respectively.

In step S280, the controller 130 determines the third insulation resistance and the fourth insulation resistance based on the third detection value and the fourth detection value.

In step S292, the controller 130 determines if the first relay 31 is faulty by comparing the first insulation resistance with the third insulation resistance. (i) When a resistance difference between the first insulation resistance and the third insulation resistance is equal to or less than the threshold resistance or (ii) when a ratio of the resistance difference to the first insulation resistance is equal to or less than a threshold ratio, the controller 130 may determine that the first relay 31 is faulty. When a value of the step S292 is "YES", step S294 may be performed.

In the step S294, the controller 130 outputs a first diagnosis signal indicating that the first relay 31 is faulty. The first diagnosis signal may be transmitted to an external device via wired/wireless communication.

In step S296, the controller 130 determines if the second relay 32 is faulty by comparing the second insulation resistance with the fourth insulation resistance. (i) When a resistance difference between the second insulation resistance and the fourth insulation resistance is equal to or less than the threshold resistance or (ii) when a ratio of the resistance difference to the second insulation resistance is equal to or less than the threshold ratio, the controller 130 may determine that the second relay 32 is faulty. When a value of the step S296 is "YES", step S298 may be performed.

In the step S298, the controller 130 outputs a second diagnosis signal indicating that the second relay 32 is faulty. The second diagnosis signal may be transmitted to an external device via wired/wireless communication.

Figure 3:
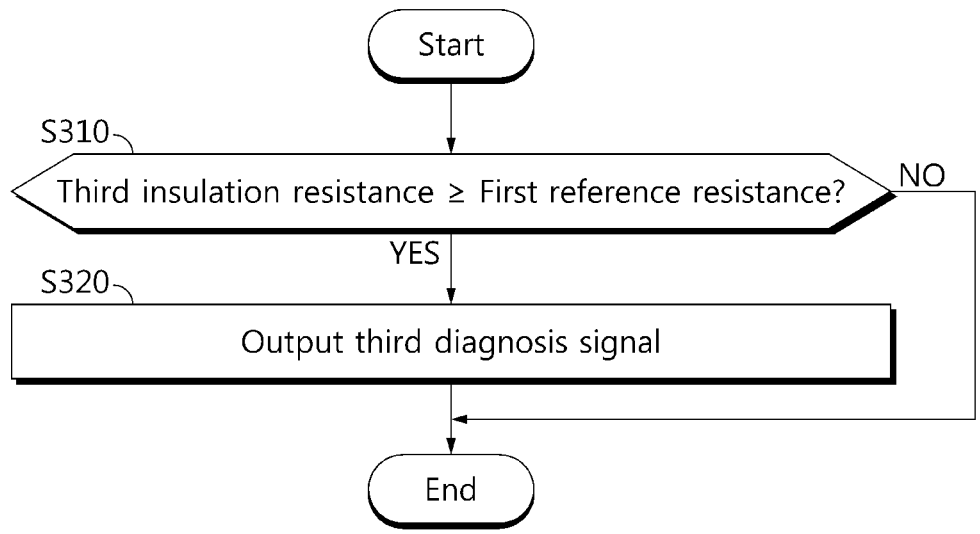
FIGS. 3 and 4 are flowcharts illustrating exemplarily a relay diagnosis method according to a second embodiment, executable by a relay diagnosis apparatus shown in FIG. 1.
Figure 4:
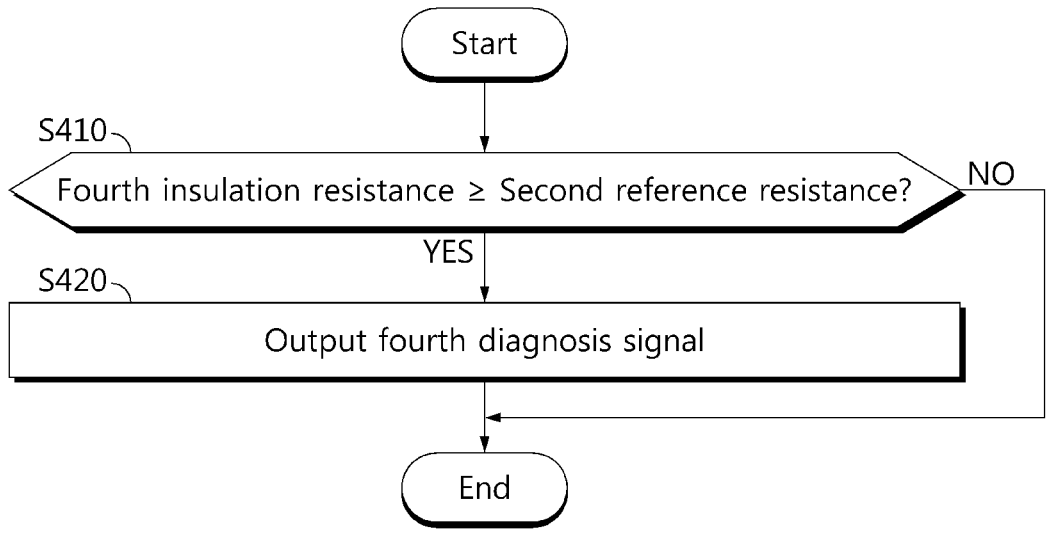

FIGS. 3 and 4 are flowcharts illustrating exemplarily a relay diagnosis method according to a second embodiment, executable by the relay diagnosis apparatus 100 shown in FIG. 1.

The method of FIG. 3 may be additionally performed when the first relay 31 is determined to be faulty in the step S292 of FIG. 2. Referring to FIGS. 1 and 3, in step S310, the controller 130 determines if the third insulation resistance is equal to or higher than first reference resistance. The first reference resistance may be a predetermined value indicating the combined resistance of the insulation resistance $R_{A1}$ and the insulation resistance $R_{B1}$ when both the first insulation condition and the third insulation condition are normal. The third insulation resistance that is equal to or higher than the first reference resistance represents that (i) at least the first insulation condition is normal among the first insulation condition and the third insulation condition, and (ii) the first relay 31 is in an open circuit fault.

In step S320, the controller 130 outputs a third diagnosis signal indicating that the first insulation condition is normal and the first relay 31 is in the open circuit fault. The third diagnosis signal may be transmitted to an external device via wired/wireless communication.

The method of FIG. 4 may be additionally performed when the first relay 31 is determined to be faulty in the step S292 of FIG. 2. Referring to FIGS. 1 and 4, in step S410, the controller 130 determines if the fourth insulation resistance is equal to or higher than second reference resistance. The second reference resistance may be a predetermined value indicating the combined resistance of the insulation resistance $R_{A2}$ and the insulation resistance $R_{B2}$ when both the second insulation condition and the fourth insulation condition are normal. The second reference resistance may be equal to the first reference resistance. The fourth insulation resistance that is equal to or higher than the second reference resistance represents that (i) at least the second insulation condition is normal among the second insulation condition and the fourth insulation condition, and (ii) the second relay 32 is in an open circuit fault.

In step S420, the controller 130 outputs a fourth diagnosis signal indicating that the second insulation condition is normal and the second relay 32 is in the open circuit fault. The fourth diagnosis signal may be transmitted to an external device via wired/wireless communication.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments described above.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A relay diagnosis apparatus for a first relay installed on a first power line connecting an electrical load of an electric vehicle to a battery assembly and a second relay installed on a second power line connecting the electrical load to the battery assembly, the relay diagnosis apparatus comprising:
   a first voltage detection circuit configured to generate a first diagnosis voltage at a first position between a positive electrode terminal of the battery assembly and a chassis of the electric vehicle;
   a second voltage detection circuit configured to generate a second diagnosis voltage at a second position between a negative electrode terminal of the battery assembly and the chassis; and
   a controller configured to:
      determine a first insulation resistance between the positive electrode terminal and the chassis based on the first diagnosis voltage at a first time point while the first relay and is controlled into an off-state;
      determine a second insulation resistance between the negative electrode terminal and the chassis based on the second diagnosis voltage at a second time point while the second relay and is controlled into an off-state;
      determine a third insulation resistance between the positive electrode terminal and the chassis based on the first diagnosis voltage at a third time point while the first relay is being controlled into an on-state;
      determine a fourth insulation resistance between the negative electrode terminal and the chassis based on the second diagnosis voltage at a fourth time point while the second relay is controlled into an on-state, and
      detect a fault of the first relay based on the first insulation resistance and the third insulation resistance; and
      detect a fault of the second relay based on the second insulation resistance and the fourth insulation resistance.

2. The relay diagnosis apparatus according to claim 1, wherein the first voltage detection circuit includes a first voltage divider and a first switch, serially connected to one another between the positive electrode terminal and the chassis,
   the second voltage detection circuit includes a second voltage divider and a second switch, serially connected to one another between the negative electrode terminal and the chassis, and
   each of the first and second voltage dividers includes two resistors in series with one another.

3. The relay diagnosis apparatus according to claim 2, wherein the controller is configured to:
   control the first switch and the second switch into the on-state and the off-state, respectively, during the first time point; and
   control the first switch and the second switch into the off-state and the on-state, respectively, during the second time point.

4. The relay diagnosis apparatus according to claim 2, wherein the controller is configured to:
   control the first switch and the second switch into the on-state and the off-state, respectively, during the third time point; and
   control the first switch and the second switch into the off-state and the on-state, respectively, during the fourth time point.

5. The relay diagnosis apparatus according to claim 1, wherein the controller is configured to determine that the first relay is faulty in response to either (i) a resistance difference between the first insulation resistance and the third insulation resistance being equal to or less than a threshold resistance, or (ii) a ratio of the resistance difference to the first insulation resistance being equal to or less than a threshold ratio.

6. The relay diagnosis apparatus according to claim 5, wherein the controller is configured to determine that the first relay is in an open circuit fault in response to the third insulation resistance being equal to or higher than a first reference resistance.

7. The relay diagnosis apparatus according to claim 1, wherein the controller is configured to determine that the second relay is faulty in response to either (i) a resistance difference between the second insulation resistance and the fourth insulation resistance being equal to or less than a threshold resistance, or (ii) a ratio of the resistance difference to the second insulation resistance being equal to or less than a threshold ratio.

8. The relay diagnosis apparatus according to claim 7, wherein the controller is configured to determine that the second relay is in an open circuit fault in response to the fourth insulation resistance being equal to or higher than a second reference resistance.

9. An electric vehicle comprising the relay diagnosis apparatus according to claim 1.

10. A relay diagnosis method for diagnosing a first relay installed on a first power line connecting an electrical load of an electric vehicle to a battery assembly and a second relay installed on a second power line connecting the electrical load to the battery assembly, the relay diagnosis method comprising:

determining, by the controller, a first insulation resistance between a positive electrode terminal of the battery assembly and a chassis of the electric vehicle based on a first diagnosis voltage generated at a first position between the positive electrode terminal of the battery assembly and the chassis at a first time point while a first relay and is controlled into an off-state;

determining, by the controller, a second insulation resistance between a negative electrode terminal of the battery assembly and the chassis based on a second diagnosis generated at a second position between the negative electrode terminal of the battery assembly and the chassis at a second time point while a second relay and is controlled into an off-state;

determining, by the controller, a third insulation resistance between the positive electrode terminal and the chassis based on the first diagnosis voltage at a third time point while the first relay is controlled into an on-state;

determining, by the controller, a fourth insulation resistance between the negative electrode terminal and the chassis based on the second diagnosis voltage at a fourth time point while the second relay is controlled into an on-state; and either:

(i) detecting, by the controller, a fault of the first relay based on the first insulation resistance and the third insulation resistance; or (ii) detecting, by the controller, a fault of the second relay based on the second insulation resistance and the fourth insulation resistance.

* * * * *